United States Patent
Lee et al.

(10) Patent No.: US 12,176,306 B2
(45) Date of Patent: Dec. 24, 2024

(54) ELECTRICAL CIRCUIT OF SEMICONDUCTOR CHANNEL RESISTOR AND APPARATUS AND METHOD FOR GENERATING THE SAME

(71) Applicant: ELECTRONICS AND TELECOMMUNICATIONS RESEARCH INSTITUTE, Daejeon (KR)

(72) Inventors: Sang Heung Lee, Daejeon (KR); Soo Cheol Kang, Daejeon (KR); Seong Il Kim, Daejeon (KR); Hae Cheon Kim, Daejeon (KR); Youn Sub Noh, Daejeon (KR); Ho Kyun Ahn, Daejeon (KR); Jong Won Lim, Daejeon (KR); Sung Jae Chang, Daejeon (KR); Hyun Wook Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 476 days.

(21) Appl. No.: 17/396,258

(22) Filed: Aug. 6, 2021

(65) Prior Publication Data
US 2022/0045022 A1 Feb. 10, 2022

(30) Foreign Application Priority Data

Aug. 7, 2020 (KR) .................. 10-2020-0099525
Dec. 7, 2020 (KR) .................. 10-2020-0169818

(51) Int. Cl.
*H01L 23/64* (2006.01)
*H01L 29/16* (2006.01)
(Continued)

(52) U.S. Cl.
CPC .......... *H01L 23/647* (2013.01); *H01L 23/642* (2013.01); *H01L 29/1608* (2013.01); *H01L 29/2003* (2013.01); *H01L 29/205* (2013.01)

(58) Field of Classification Search
CPC . H01L 23/647; H01L 23/642; H01L 29/1608; H01L 27/0207
See application file for complete search history.

(56) References Cited

U.S. PATENT DOCUMENTS 8,941,231 B2   1/2015  Park et al.
9,158,878 B2*  10/2015 Sakanushi ............. G06F 30/392
(Continued)

FOREIGN PATENT DOCUMENTS

JP  2003264292 A   9/2003
JP  2005-340339 A  12/2005
(Continued)

*Primary Examiner* — Vu A Vu
*Assistant Examiner* — Valerie N Newton (57) ABSTRACT

An apparatus and method for generating an electrical circuit of semiconductor channel resistor including a first passive element part including a resistor and a capacitor connected in parallel between a first port and a second port, and an ohmic resistor connected in series to the resistor and the capacitor which are connected in parallel are provided. The apparatus includes a substrate selection part configured to receive a selected substrate item; a resistor selection part configured to receive a selected resistor item; a capacitor selection part configured to receive a selected capacitor item; and a circuit generating part configured to generate an electrical circuit from the selected substrate item, the selected resistor item, and the selected capacitor item.

6 Claims, 7 Drawing Sheets

(51) Int. Cl.
  *H01L 29/20* (2006.01)
  *H01L 29/205* (2006.01)

(56) References Cited

U.S. PATENT DOCUMENTS

2003/0200071 A1    10/2003  Zhang et al.
2016/0191018 A1     6/2016  Jeong et al.
2019/0348408 A1 *  11/2019  Wang .................... H02M 1/084

FOREIGN PATENT DOCUMENTS

| JP | 2016092314 A | | 5/2016 | |
| KR | 100766214 B1 | | 10/2007 | |
| KR | 2016-0037747 A | * | 4/2016 | ............. H01L 27/02 |
| KR | 1020160037747 A | | 4/2016 | |

* cited by examiner

ELECTRICAL CIRCUIT OF SEMICONDUCTOR CHANNEL RESISTOR AND APPARATUS AND METHOD FOR GENERATING THE SAME

CROSS-REFERENCE TO RELATED APPLICATION

This application claims priority to and the benefit of Korean Patent Application Nos. 10-2020-0099525 and 10-2020-0169818, filed on Aug. 7, 2020 and Dec. 7, 2020, respectively, the disclosures of which are incorporated herein by reference in their entirety.

BACKGROUND

1. Field of the Invention

The present invention relates to a semiconductor channel resistor, and more specifically, to an electrical circuit of semiconductor channel resistor and an apparatus and method for generating the electrical circuit.

2. Discussion of Related Art

In order to design a semiconductor integrated circuit, not only active elements but also passive elements such as a resistor, an inductor, a capacitor, etc. are required. Among the above, a resistor formed on a semiconductor substrate includes a thin film resistor for low resistance and a channel resistor for medium resistance and high resistance.

Figure 1:
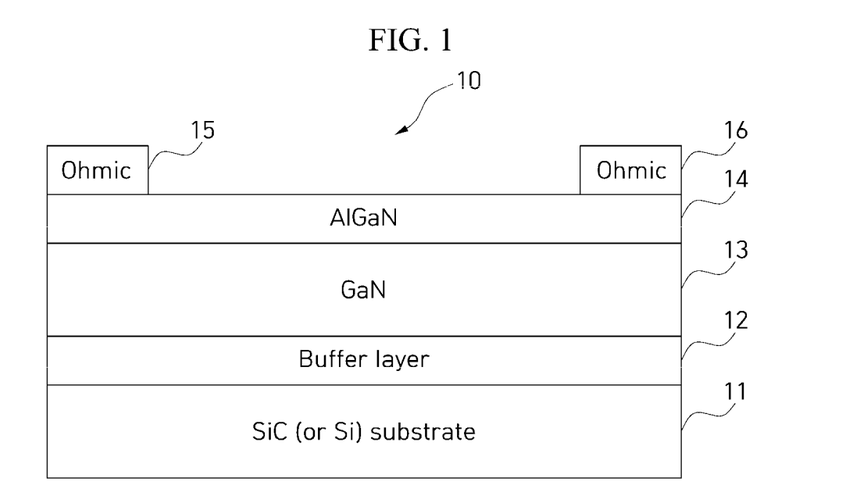
FIG. 1 is a cross-sectional view of a semiconductor channel resistor using AlGaN/GaN channel layers.

FIG. 1 illustrates a cross-sectional view of a channel resistor 10 fabricated using AlGaN/GaN channel layers on SiC (or Si) substrate. The channel resistor 10 is fabricated by forming ohmic contact portions 15 and 16 for a metal electrode on the AlGaN/GaN channel layers 13 and 14 formed on a buffer layer 12 on the SiC (or Si) substrate 11. Here, the AlGaN/GaN channel layers 13 and 14 are used for carrier movement of a transistor, which is an active element, but are also a resistor for medium resistance and high resistance.

Figure 2:
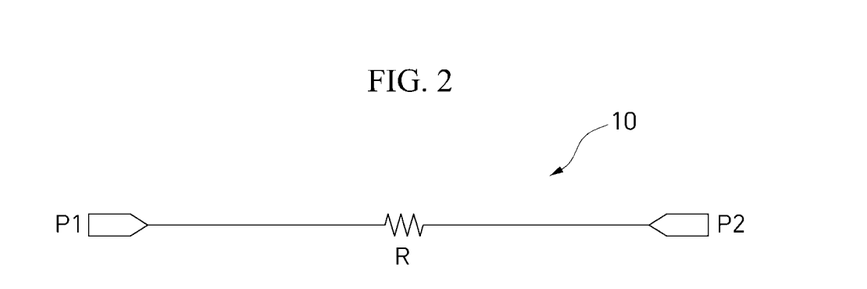
FIG. 2 illustrates an electrical circuit of semiconductor channel resistor generated by a conventional method.

FIG. 2 illustrates one type of an electrical circuit conventionally generated for the channel resistor 10 fabricated in the AlGaN/GaN channel layers on the SiC or Si substrate. To generate the electrical circuit, the resistor 10 which is fabricated using the AlGaN/GaN channel layers as shown in FIG. 1 is connected as a simple resistor R between a first port P1 and a second port P2.

Figure 3:
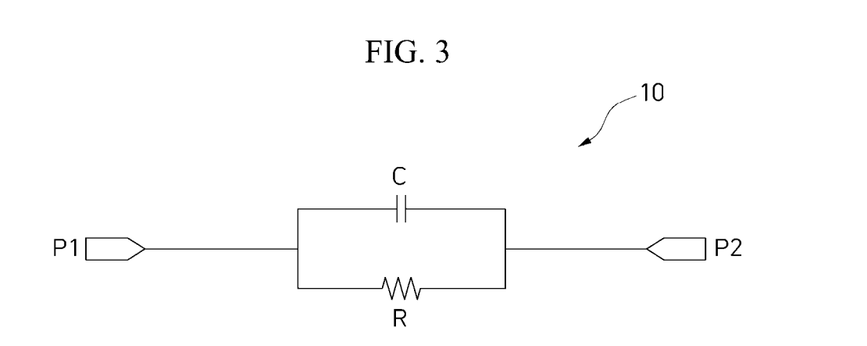
FIG. 3 illustrates an electrical circuit of semiconductor channel resistor generated by another conventional method.

FIG. 3 illustrates an electrical circuit of another type which is conventionally generated for the channel resistor 10 fabricated in the AlGaN/GaN channel layers on the SiC or Si substrate. The electrical circuit is generated so that a main resistor R and a main capacitor C are connected in parallel between a first port P1 and a second port P2, as the resistor 10 which is fabricated using the AlGaN/GaN channel layers as shown in FIG. 1.

Like the above, according to a conventional method of generating a semiconductor channel resistor as an electrical circuit, the electrical circuit has been generated in a simple electrical connection using a simple resistor component, or resistor and capacitor components.

However, in the semiconductor channel resistor in FIG. 1, a resistance component of the substrate itself (i.e., substrate resistance), a substrate capacitance component, and an ohmic resistance component due to an ohmic process for a metal electrode are further present. Therefore, the electrical circuit of the semiconductor channel resistor simply generated as shown in FIGS. 2 and 3 may cause an error between designed and measured results.

SUMMARY OF THE INVENTION

The present invention is directed to proposing a technology for generating an electrical circuit capable of accurately providing a characteristic of a semiconductor channel resistor by including a substrate resistance component, a substrate capacitance component, and an ohmic resistance component in addition to a main resistor and a main capacitor.

According to an aspect of the present invention, there is provided an electrical circuit of semiconductor channel resistor formed on a semiconductor substrate, including a first passive element part including a resistor and a capacitor connected in parallel between a first port and a second port, and an ohmic resistor connected in series to the resistor and the capacitor which are connected in parallel. The electrical circuit may further include a second passive element part connected between the first port and the ground, and a third passive element part connected between the second port and the ground. The second passive element part may include one of a resistor, a capacitor, and a resistor and a capacitor which are connected in parallel, and the third passive element part may include one of a resistor, a capacitor, and a resistor and a capacitor which are connected in parallel.

According to another aspect of the present invention, there is provided an apparatus for generating an electrical circuit of semiconductor channel resistor, including a substrate selection part configured to receive a selected substrate item, wherein the substrate items include a SiC item and a Si item; a resistor selection part configured to receive a selected resistor item, wherein the resistor items include a main resistor item, an ohmic resistor item, a first port P1-side substrate resistor item, and a second port P2-side substrate resistor item; a capacitor selection part configured to receive a selected capacitor item, wherein the capacitor items include a main capacitor item, a P1-side substrate capacitor item, and a P2-side substrate capacitor item; and a circuit generating part configured to generate an electrical circuit from the selected substrate item, the selected resistor item, and the selected capacitor item.

Further, according to still another aspect of the present invention, there is provided a method of generating an electrical circuit of semiconductor channel resistor, including: determining whether a main resistor and a main capacitor are selected through the resistor selection part and the capacitor selection part, and connecting the selected main resistor and main capacitor in parallel between a P1 and a P2; determining whether an ohmic resistor is selected through the resistor selection part to generate the main resistor and the main capacitor which are connected in parallel between the P1 and the P2 as a final circuit when the ohmic resistor is not selected; connecting the selected ohmic resistor between the main resistor and the main capacitor which are connected in parallel and the P1 in series when the ohmic resistor is selected; and determining whether a SiC substrate or a Si substrate is selected as a semiconductor substrate through the substrate selection part, and generating the main resistor and the main capacitor connected in parallel between the P1 and the P2, and the ohmic resistor connected in series between the P1 and the P2 as the final circuit when it is determined that the SiC substrate is selected.

The above-described configurations and operations of the present invention will become more apparent from embodiments described in detail below with reference to the drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Advantages and features of the present invention, and a method of achieving them, will be apparent with reference to embodiments which is described in detail in conjunction with the accompanying drawings. However, the present invention is not limited to the embodiments which will be described below and may be implemented in different forms. The embodiments are only provided to completely disclose the present invention and completely convey the scope of the present invention to those skilled in the art, and the present invention is defined by the disclosed claims. Meanwhile, terms used in the description are provided not to limit the present invention but to describe the embodiments. In the embodiments, the singular form is intended to also include the plural form unless the context clearly indicates otherwise. The terms 'comprise' and/or 'comprising' as used herein do not preclude the presence or addition of at least one other component, step, operation, and/or element other than the stated components, steps, operations and/or elements.

Hereinafter, preferable embodiments of the present invention will be described in detail with reference to the accompanying drawings. In the addition of reference numerals to the components of each drawing, the same components are given to the same reference numerals as much as possible even when the components are shown on different drawings, and in the description of the present invention, when detailed descriptions of related known components or functions may obscure principle of the present invention, the detailed descriptions thereof will be omitted.

Figure 4:
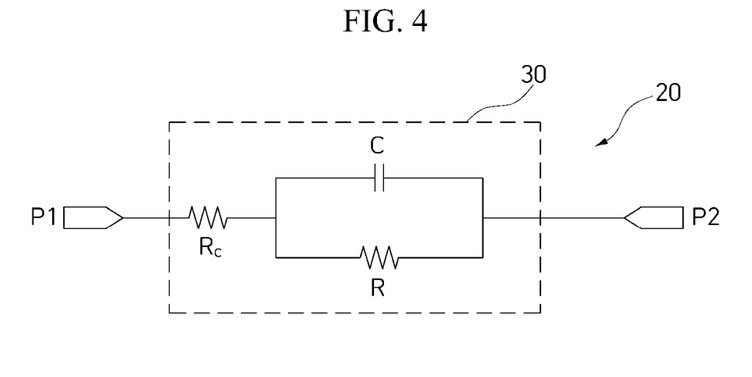
FIG. 4 illustrates an electrical circuit of semiconductor channel resistor generated by one embodiment of the present invention.

FIG. 4 illustrates an electrical circuit of semiconductor channel resistor 20 generated according to one embodiment of the present invention, which is an electrical circuit generated when the resistance of a semiconductor substrate is large (such as silicon carbide (SiC) substrate) and so the parasitic component of the substrate can be neglected. Referring to FIG. 4, a passive element part 30 included in the semiconductor channel resistor 20 between a first port P1 and a second port P2 has an ohmic resistor Rc further connected in series to a main resistor R and a main capacitor C connected in parallel as shown in FIG. 3.

The channel resistor 10 in FIG. 3 should have actually been the channel resistor 20 in FIG. 4, because of an ohmic contact process. Accordingly, the electrical circuit in FIG. 3 which illustrates a conventionally generated electrical circuit is one that the ohmic resistor Rc was omitted. In the present invention, it is possible to provide an electrical circuit with greatly improved accuracy by generating a circuit in consideration of the ohmic resistor Rc.

Figure 5:
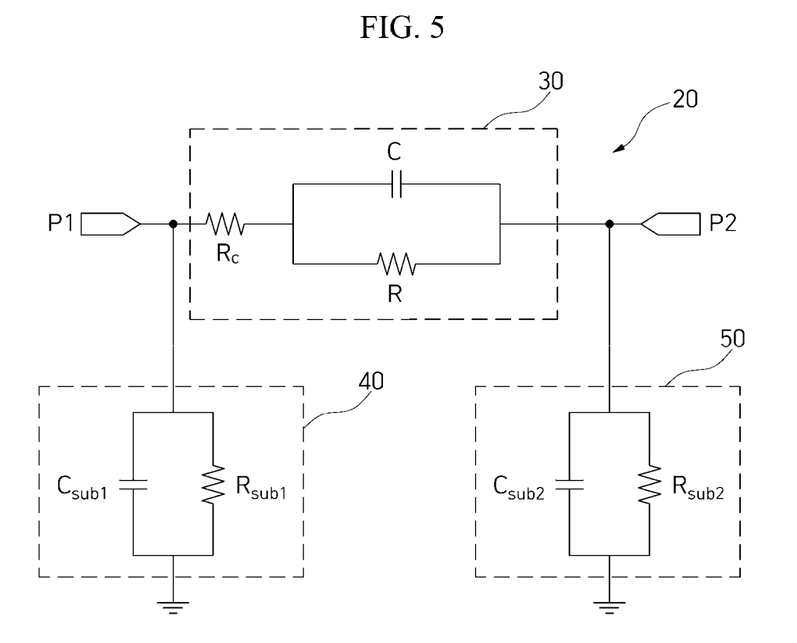
FIG. 5 illustrates an electrical circuit of semiconductor channel resistor generated by another embodiment of the present invention.

FIG. 5 illustrates an electrical circuit of semiconductor channel resistor 20 generated according to another embodiment of the present invention. It illustrates an electrical circuit generated when the resistance of a semiconductor substrate is small (such as silicon (Si) substrate) and so the parasitic component of the substrate cannot be neglected. Referring to FIG. 5, the electrical circuit of semiconductor channel resistor 20 includes a first passive element part 30, a second passive element part 40, and a third passive element part 50.

The first passive element part 30 between a first port P1 and a second port P2 is the same as a case in which the ohmic resistor Rc is connected in series to the main resistor R and the main capacitor C which are connected in parallel as shown in FIG. 4. The second passive element part 40 between the first port P1 and the ground includes one of a P1-side substrate resistor Rsub1 and a P1-side substrate capacitor Csub1, or both the resistor Rsub1 and the capacitor Csub1 connected in parallel. The third passive element part 50 between the second port P2 and the ground includes one of a P2-side substrate resistor Rsub2 and a P2-side substrate capacitor Csub2, or both the resistor Rsub2 and the capacitor Csub2 connected in parallel.

From the above: The semiconductor channel resistor 20 may be formed on a SiC substrate or a Si substrate. In the case that the semiconductor channel resistor 20 is formed on the SiC substrate, since the resistance of the SiC substrate is large, it is sufficient to generate the electrical circuit as in FIG. 4. On the other hand, in the case that the semiconductor channel resistor 20 is formed on the Si substrate, since the resistance of the Si substrate is small and thus the substrate component should be considered, the semiconductor channel resistor 20 should be generated as the electrical circuit in FIG. 5 that the second passive element part 40 and the third passive element part 50 are added to the electrical circuit in FIG. 4.

In FIG. 5, a value of the Rsub1 of the second passive element part 40 and a value of the Rsub2 of the third passive element part 50 may be either the same or different. Further, a value of the Csub1 of the second passive element part 40 and a value of the Csub2 of the third passive element part 50 may be either the same or different.

Figure 6:
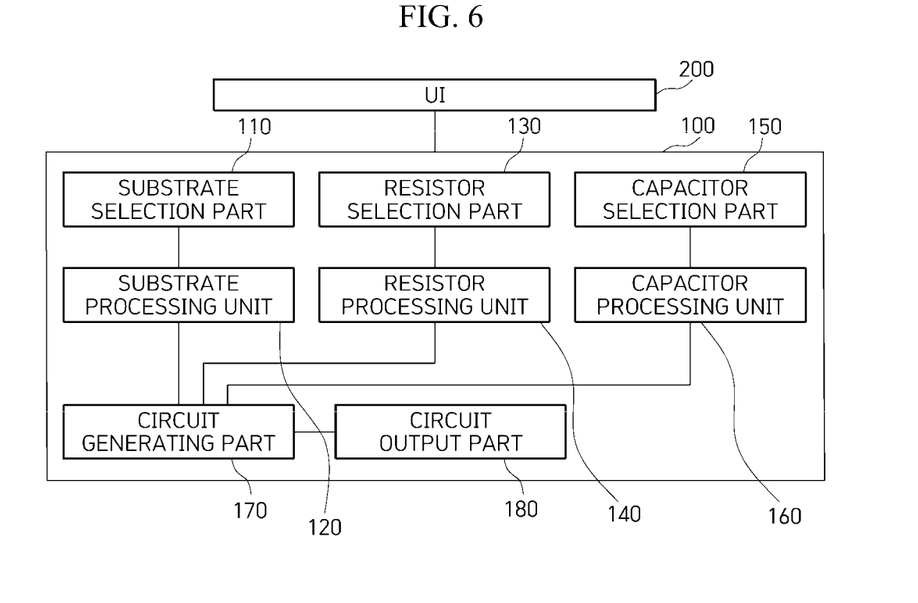
FIG. 6 is a block diagram of an apparatus for generating the electrical circuit of semiconductor channel resistor according to the present invention.

FIG. 6 illustrates a block diagram of an apparatus for generating the electrical circuit of the above-described semiconductor channel resistor 20, in which an electrical circuit generating apparatus 100 and a user interface (UI) 200 are connected with each other.

The electrical circuit generating apparatus 100 includes: a substrate selection part 110 which provides a user accessing the user interface 200 with options for selecting a substrate item and receives the selected substrate item; a substrate processing unit 120 which receives the selected substrate item to process a task related to the substrate item; a resistor selection part 130 which provides a user connected to the user interface 200 with options for selecting a resistor item and receives the selected resistor item; a resistor processing unit 140 which receives the selected resistor item to process a task related to the resistor item; a capacitor selection part 150 which provides a user connected to the user interface 200 with options for selecting a capacitor item and receives the selected capacitor item; a capacitor processing unit 160 which receives the selected capacitor item to process a task related to the capacitor item; a circuit generating part 170 which generates an electrical circuit from the processed substrate item, the processed resistor item, and the processed capacitor item; and a circuit output part 180 which outputs data for outputting the generated electrical circuit in a manner such as screen display, printing, signal transmission, and the like.

The electrical circuit generating apparatus 100 configured in this way may be implemented as a computer or processor consisting of hardware and/or software. Further, the user interface 200 consists of hardware and/or software and may be implemented as a computer or processor including a display screen, a printer, etc.

Figure 7:
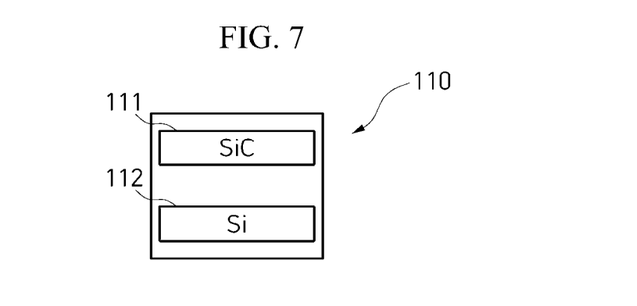
FIG. 7 illustrates substrate items of a substrate selection part (110)

FIG. 7 illustrates substrate items of the substrate selection part 110. The substrate selection part 110 provides a SiC item 111 and a Si item 112 to the user to select whether a substrate type (i.e., material) is SiC or Si.

Figure 8:
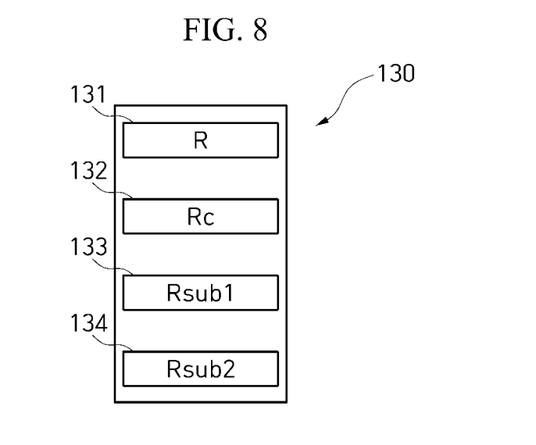
FIG. 8 illustrates resistor items of a resistor selection part (130)

FIG. 8 illustrates resistor items of the resistor selection part 130. A main resistor (R) item 131, an ohmic resistor (Rc) item 132, a P1-side substrate resistor (Rsub1) item 133, and a P2-side substrate resistor (Rsub2) item 134 are included in the resistor items and provided to the user.

Figure 9:
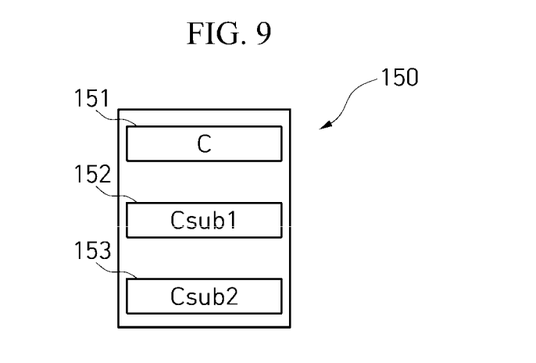
FIG. 9 illustrates capacitor items of a capacitor selection part (150)

FIG. 9 illustrates capacitor items of the capacitor selection part 150. A main capacitor (C) item 151, a P1-side substrate capacitor (Csub1) item 152, and a P2-side substrate capacitor (Csub2) item 153 are included in the capacitor items and provided to the user.

Figure 10:
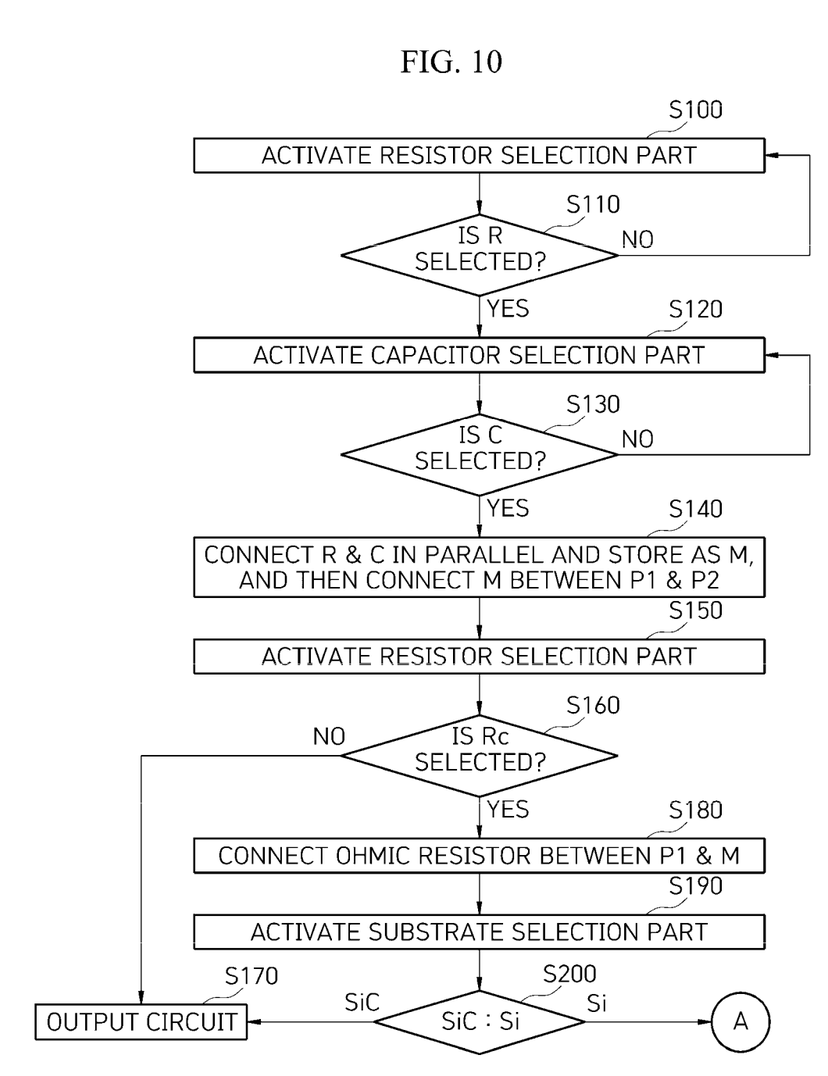
FIGS. 10 to 12 are flowcharts of a process of a method of generating the electrical circuit of semiconductor channel resistor according to the present invention.
Figure 11:
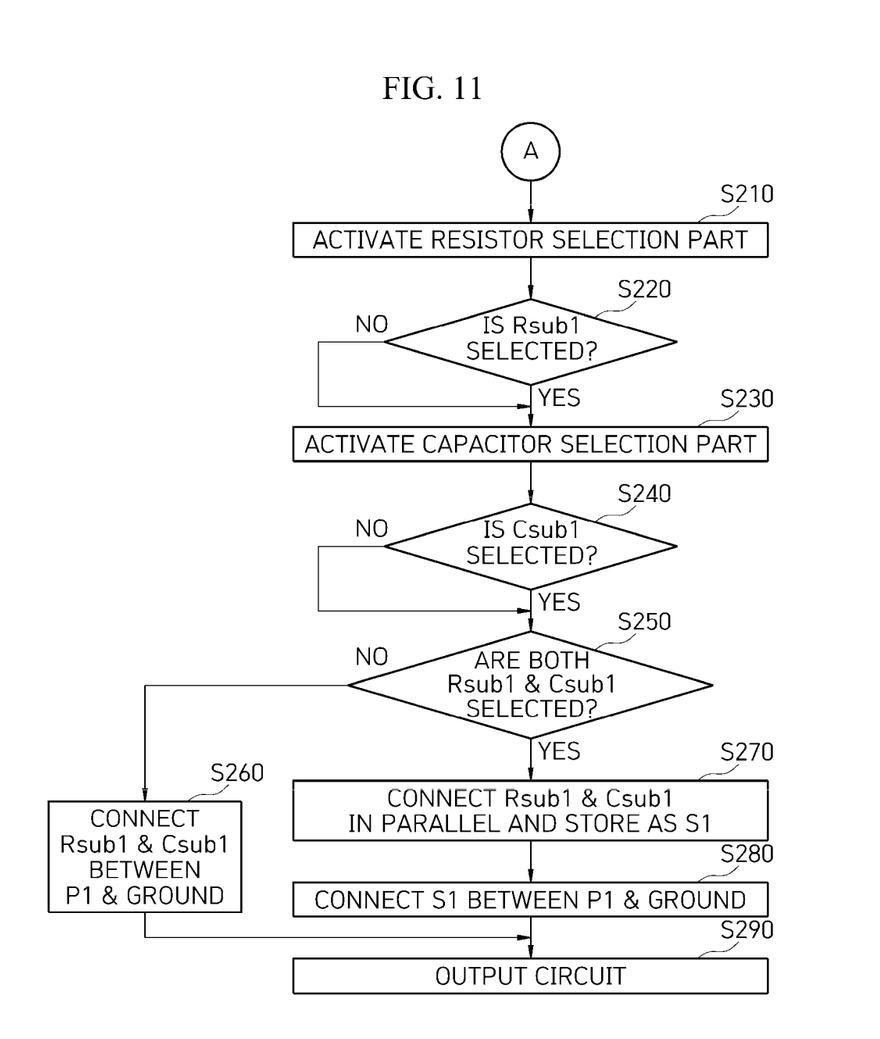
Figure 12:
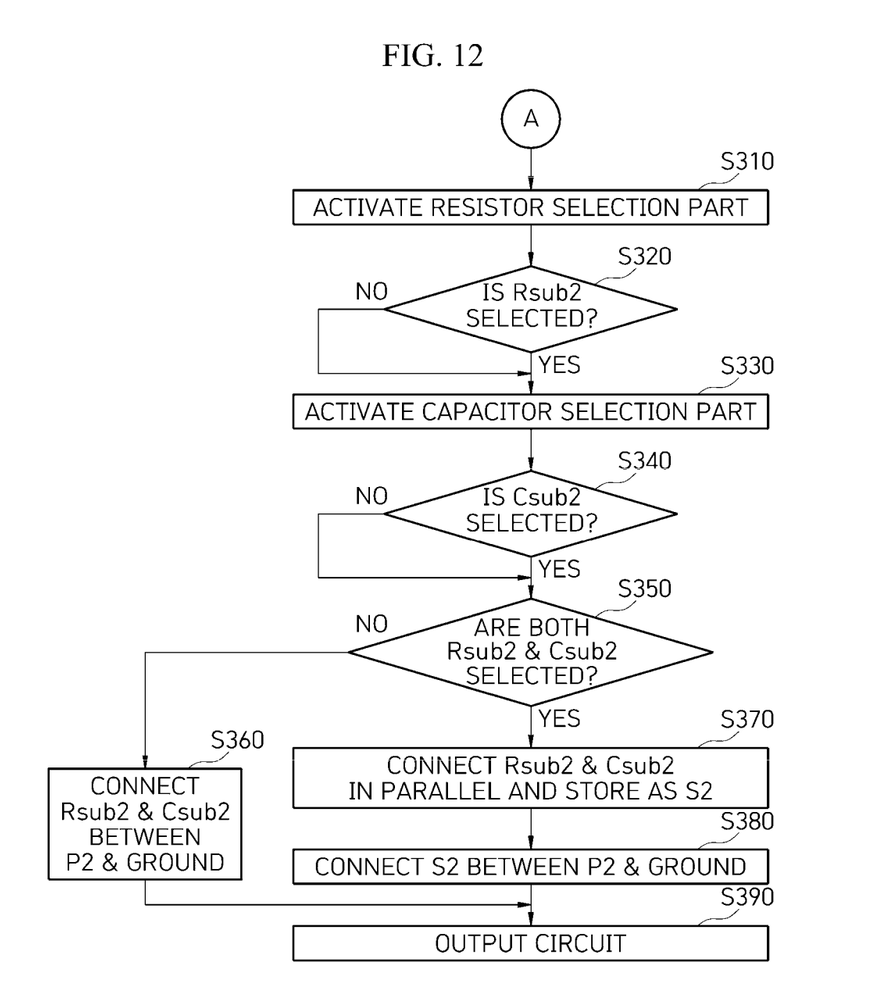

Descriptions of functions (task processing) of the electrical circuit generating apparatus 100 configured as shown in FIGS. 6 to 9 can be equivalent to a description of a process flow of a method of generating the electrical circuit with reference to FIGS. 10 to 12.

Referring to FIG. 10: The resistor selection part 130 is activated and so options are provided for the user to select one of the resistor items (S100). It is determined whether the main resistor is selected (S110). If the main resistor is selected, the capacitor selection part 150 is activated to provide the capacitor items to the user so that the user can select one of the capacitor items (S120). It is determined whether the main capacitor is selected (S130). If the main capacitor is selected, the selected main resistor and main capacitor are connected in parallel to generate the passive element part 30 mentioned in FIG. 4 and the passive element part 30 is stored as M, and the M is connected between P1 and P2 (S140). Further, the resistor items are provided to the user for one to be selected by activating the resistor selection part 130 again (S150). It is determined whether the ohmic resistor is selected (S160). If the ohmic resistor is not selected, the M connected between P1 and P2 generated in the operation S140 above is output as a final circuit (S170). On the other hand, if the ohmic resistor is selected, the selected ohmic resistor is connected between M and P1 generated in the operation S140 (S180). Further, by activating the substrate selection part 110 (S190), the substrate items are provided for the user for one to be selected (S200). If the user selects the SiC substrate item in the substrate selection part 110, a circuit in which the ohmic resistor and the passive element part 30 (M) are connected in series between P1 and P2 generated in the operation S180 is output (S170).

The above is the content related to the method of generating the above-described circuit in FIG. 4. On the other hand, if the substrate item Si is selected in the above-described operation S200, a process of FIG. 11 related to the method of generating the above-described circuit in FIG. 5 proceeds.

In the above, an operation of selecting whether the semiconductor substrate is SiC or Si material is not located at the same position as in FIG. 10 but may be performed at a different position. For example, before the operation S100, a task of selecting whether the semiconductor substrate is SiC or Si material may be performed as an initial operation.

In FIG. 11, if the substrate item Si is selected in the above-described operation S200, the resistor selection part 130 is activated (S210) and the resistor items other than the previously selected main resistor and ohmic resistor among the resistor items are provided to the user for one to be selected. By determining whether the P1-side substrate resistor is selected or not (S220) and activating the capacitor selection part 150 (S230), the capacitor items other than the previously selected main capacitor among the capacitor items are provided to the user for one to be selected. It is determined whether the P1-side substrate capacitor is selected or not (S240). It is determined whether only one of the P1-side substrate resistor and the P1-side substrate capacitor is selected or both are selected in the above-described operations S220 and S240 above (S250). If only one of the two is selected, the selected P1-side substrate resistor or P1-side substrate capacitor is connected between P1 and the ground (S260), and the final circuit generated in the above is output (S290). On the other hand, if it is determined that both the P1-side substrate resistor and the P1-side substrate capacitor are selected, the P1-side substrate resistor and the P1-side substrate capacitor are connected in parallel to generate the second passive element part 40 described above in FIG. 5, and the second passive element part 40 is stored as S1 (S270). The S1 is connected between P1 and the ground (S280). Further, the final circuit generated in the above is output (S290).

The above process in FIG. 11 is a process related to the second passive element part 40 connected between the P1-side of the semiconductor substrate and the ground, and thus, in order to generate a complete electrical circuit as shown in FIG. 5, the third passive element part 50 connected between the P2-side of the semiconductor substrate and the ground should also be considered. This will be described with reference to FIG. 12. Generation of an electrical circuit for the third passive element part 50 is similar to generation of an electrical circuit for the second passive element part 40 shown in FIG. 11. The following description of the process in FIG. 12 follows the description of FIG. 11 in order of explanation, but in reality, there is no chronological order between the process of FIG. 11 and the process of FIG. 12 and the processes need not be sequential (that is, parallel processing is also possible).

Referring to FIG. 12, if the substrate item Si is selected in the above-described operation S200 (in FIG. 10), the resistor selection part 130 is activated (S310) and the resistor items other than the previously selected main resistor and ohmic resistor among the resistor items are provided to the user for one to be selected. By determining whether the P2-side substrate resistor is selected or not (S320) and activating the capacitor selection part 150 (S330), the capacitor items other than the previously selected main capacitor among the capacitor items are provided to the user for one to be selected. It is determined whether the P2-side substrate capacitor is selected or not (S340). It is determined whether only one of the P2-side substrate resistor and the P2-side substrate capacitor is selected or both are selected in the above-described operations S320 and S340 (S350). If only one of the two is selected, the selected P2-side substrate resistor or P2-side substrate capacitor is connected between P2 and the ground (S360), and the final circuit generated in the above is output (S390). On the other hand, if it is determined that both the P2-side substrate resistor and the P2-side substrate capacitor are selected, the P2-side substrate resistor and the P2-side substrate capacitor are connected in parallel to generate the third passive element part 50 described above in FIG. 5, and the third passive element part 50 is stored as S2 (S370). The S2 is connected between P2 and the ground (S380). Further, the final circuit generated in the above is output (S390).

The method of the present invention and/or the function or process of each component of apparatus which are described above may be implemented as hardware devices including at least one of a digital signal processor (DSP), a processor, a controller, an application-specific IC (ASIC), a programmable logic element (FPGA or the like), and other electronic devices, and a combination thereof. Further, the method and the function or process may be implemented as software in combination with the hardware device or independently, and the software may be stored in a storage medium.

Unlike conventional electrical circuit of semiconductor channel resistor generation, according to electrical circuit of semiconductor channel resistor generation of the present invention, since a substrate resistance component and a substrate capacitance component due to a semiconductor substrate and channel charge, and an ohmic resistance component by an ohmic process for a metal electrode are included and thus it is possible to accurately reflect characteristics of a semiconductor channel resistor, a semiconductor channel resistance design or an integrated circuit design including the semiconductor channel resistor can be more accurately designed.

Although the present invention has been described in detail through preferable embodiments of the present invention, those skilled in the art may understand that the present invention may be embodied in specific forms other than contents disclosed in the specification without changing the technical spirit or essential features of the present invention. The above-described embodiments should be understood as being exemplary and not limiting. Further, the scope of the present invention will be shown by the appended claims rather than the above-described detailed description, and all possible changes or modifications in forms derived from the scope of the claims and equivalents thereof should be understood as being within the scope of the present invention.

What is claimed is:

1. An apparatus for generating an electrical circuit of semiconductor channel resistor, the apparatus comprising:
   a substrate selection part configured to receive a selected substrate item, wherein the selected substrate item comprises one of a SiC substrate item and a Si substrate item;
   a resistor selection part configured to receive a selected resistor item, wherein the selected resistor item comprises one or more of a main resistor item, an ohmic resistor item, a first substrate resistor item at a first port, and a second substrate resistor item at a second port;
   a capacitor selection part configured to receive a selected capacitor item, wherein the selected capacitor item comprises one or more of a main capacitor item, a first substrate capacitor item at the first port, and a second substrate capacitor item at the second port; and
   a circuit generating part configured to generate an electrical circuit from the selected substrate item, the selected resistor item, and the selected capacitor item,
   wherein the circuit generating part is configured to:
   determine whether the SiC substrate item or the Si substrate item is selected by the substrate selection part;
   when the SiC substrate item is selected, determine whether the main resistor item and the main capacitor item are selected by the resistor selection part and the capacitor selection part, respectively, and connect the main resistor item and the main capacitor item in parallel between the first port and the second port;
   determine whether the ohmic resistor item is selected by the resistor selection part;
   when the ohmic resistor item is not selected, generate the main resistor item and the main capacitor item which are connected in parallel between the first port and the second port as the electrical circuit; and
   when the ohmic resistor item is selected, connect the ohmic resistor item between the main resistor item and the main capacitor item which are connected in parallel and the first port in series.

2. The apparatus of claim 1, wherein the circuit generating part is further configured to:
   when the Si substrate item is selected, determine whether the main resistor item and the main capacitor item are selected by the resistor selection part and the capacitor selection part, respectively, and connect the main resistor item and the main capacitor item in parallel between the first port and the second port;
   determine whether the ohmic resistor item is selected by the resistor selection part;
   when the ohmic resistor item is not selected, generate the main resistor item and the main capacitor item which are connected in parallel between the first port and the second port as the electrical circuit;
   when the ohmic resistor item is selected, connect the ohmic resistor item between the main resistor item and the main capacitor item which are connected in parallel and the first port in series;
   determine whether the first substrate resistor item is selected or not by the resistor selection part, and determine whether the first substrate capacitor item is selected or not by the capacitor selection part to determine whether only one of the first substrate resistor item and the first substrate capacitor item is selected or both the first substrate resistor item and the first substrate capacitor item are selected; and
   connect the first substrate resistor item or the first substrate capacitor item between the first port and the ground to generate the electrical circuit when only one of the first substrate resistor item and the first substrate capacitor item is selected, or connect the first substrate resistor item and the first substrate capacitor item in parallel between the first port and the ground to generate the electrical circuit when both the first substrate resistor item and the first substrate capacitor item are selected.

3. The apparatus of claim 1, wherein the circuit generating part is further configured to:
  when the Si substrate item is selected, determine whether the main resistor item and the main capacitor item are selected by the resistor selection part and the capacitor selection part, respectively, and connect the main resistor item and the main capacitor item in parallel between the first port and the second port;
  determine whether the ohmic resistor item is selected by the resistor selection part;
  when the ohmic resistor item is not selected, generate the main resistor item and the main capacitor item which are connected in parallel between the first port and the second port as the electrical circuit;
  when the ohmic resistor item is selected, connect the ohmic resistor item between the main resistor item and the main capacitor item which are connected in parallel and the first port in series;
  determine whether the second substrate resistor item is selected or not by the resistor selection part, and determine whether the second substrate capacitor item is selected or not by the capacitor selection part to determine whether only one of the second substrate resistor item and the second substrate capacitor item is selected or both the second substrate resistor item and the second substrate capacitor item are selected; and
  connect the second substrate resistor item or the second substrate capacitor item between the second port and the ground to generate the electrical circuit when only one of the second substrate resistor item and the second substrate capacitor item is selected, or connect the second substrate resistor item and the second substrate capacitor item in parallel between the second port and the ground to generate the electrical circuit when both the second substrate resistor item and the second substrate capacitor item are selected.

4. A method of generating the electrical circuit of semiconductor channel resistor performed in the apparatus for generating the electrical circuit of semiconductor channel resistor of claim 1, the method comprising:
  determining whether the main resistor item and the main capacitor item are selected by the resistor selection part and the capacitor selection part, and connecting the selected main resistor item and the selected main capacitor item in parallel between the first port and the second port;
  determining whether the ohmic resistor item is selected by the resistor selection part to generate the main resistor item and the main capacitor item which are connected in parallel between the first port and the second port as the electrical circuit when the ohmic resistor item is not selected;
  connecting the ohmic resistor item between the main resistor item and the main capacitor item which are connected in parallel and the first port in series when the ohmic resistor item is selected; and
  determining whether the SiC substrate item or the Si substrate item is selected as a semiconductor substrate by the substrate selection part, and generating the main resistor item and the main capacitor item connected in parallel between the first port and the second port, and the ohmic resistor item connected in series between the first port and the second port as the electrical circuit when it is determined that the SiC substrate item is selected.

5. The method of claim 4, when it is determined that the Si substrate item is selected by the substrate selection part, further comprising:
  determining whether the first substrate resistor item is selected or not by the resistor selection part, and determining whether the first substrate capacitor item is selected or not by the capacitor selection part to determine whether only one of the first substrate resistor item and the first substrate capacitor item is selected or both the first substrate resistor item and the first substrate capacitor item are selected; and
  connecting the first substrate resistor item or the first substrate capacitor item between the first port and the ground to generate the electrical circuit when only one of the first substrate resistor item and the first substrate capacitor item is selected, or connecting the first substrate resistor item and the first substrate capacitor item in parallel between the first port and the ground to generate the electrical circuit when both the first substrate resistor item and the first substrate capacitor item are selected.

6. The method of claim 4, when it is determined that the Si substrate item is selected by the substrate selection part, further comprising:
  determining whether the second substrate resistor item is selected or not by the resistor selection part, and determining whether the second substrate capacitor item is selected or not by the capacitor selection part to determine whether only one of the second substrate resistor item and the second substrate capacitor item is selected or both the second substrate resistor item and the second substrate capacitor item are selected; and
  connecting the second substrate resistor item or the second substrate capacitor item between the second port and the ground to generate the electrical circuit when only one of the second substrate resistor item and the second substrate capacitor item is selected, or connecting the second substrate resistor item and the second substrate capacitor item in parallel between the second port and the ground to generate the electrical circuit when both the second substrate resistor item and the second substrate capacitor item are selected.

\* \* \* \* \*